(12) United States Patent
Kim et al.

(10) Patent No.: US 7,361,940 B2
(45) Date of Patent: Apr. 22, 2008

(54) LEADFRAME AND PACKAGED LIGHT EMITTING DIODE

(75) Inventors: Do Hyung Kim, Suwon-si (KR); Chung Hoon Lee, Gwangmyeong-si (KR); Keon Young Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 11/178,144

(22) Filed: Jul. 8, 2005

(65) Prior Publication Data

US 2006/0133044 A1  Jun. 22, 2006

(30) Foreign Application Priority Data

Dec. 16, 2004 (KR) .................. 10-2004-0106936
Dec. 28, 2004 (KR) .................. 10-2004-0113722
Jan. 3, 2005 (KR) .................. 10-2005-0000269

(51) Int. Cl.
*H01L 33/00* (2006.01)

(52) U.S. Cl. .................. 257/99; 257/98; 257/100; 257/675; 257/E33.058; 257/E33.075

(58) Field of Classification Search .............. 257/99, 257/100, 675, 676, E33.056, E33.066, E33.075, 257/81, 707, 98, E33.058
See application file for complete search history.

(56) References Cited

U.S. PATENT DOCUMENTS

| | | | | |
|---|---|---|---|---|
| 5,958,100 A | * | 9/1999 | Farnworth et al. | 65/47 |
| 6,274,924 B1 | * | 8/2001 | Carey et al. | 257/676 |
| 6,517,218 B2 | * | 2/2003 | Hochstein | 362/294 |
| 7,075,114 B2 | * | 7/2006 | Abe et al. | 257/98 |
| 2001/0030866 A1 | * | 10/2001 | Hochstein | 362/294 |
| 2004/0041222 A1 | * | 3/2004 | Loh | 257/433 |
| 2004/0126913 A1 | * | 7/2004 | Loh | 438/26 |
| 2006/0012299 A1 | * | 1/2006 | Suehiro et al. | 313/512 |
| 2006/0103012 A1 | * | 5/2006 | Chin | 257/712 |

* cited by examiner

*Primary Examiner*—Minhloan Tran
*Assistant Examiner*—Benjamin Tzu-Hung Liu
(74) *Attorney, Agent, or Firm*—Townsend and Townsend and Crew LLP

(57) ABSTRACT

A leadframe that is configured to be used with an electronic device, e.g., light emitting diode (LED), includes a heat sink supporting ring for supporting a heat sink. An outer frame is spaced apart from the heat sink supporting ring, and encloses the heat sink supporting ring. At least one supporting lead connects the heat sink supporting ring and the outer frame. A separated lead is extended from the outer frame toward the heat sink supporting ring, and is spaced apart from the heat sink supporting ring. A package body that may be formed by an injection molding after a heat sink is inserted into the leadframe.

19 Claims, 11 Drawing Sheets

LEADFRAME AND PACKAGED LIGHT EMITTING DIODE

CROSS-REFERENCES TO RELATED APPLICATIONS

The present application claims priority to Korean Patent Application No. 10-2004-0106936, filed Dec. 16, 2004, Korean Patent Application No. 10-2004-0113722, filed Dec. 28, 2004, Korean Patent Application No. 10-2005-0000269, filed Jan. 3, 2005, which are incorporated by reference.

BACKGROUND OF THE INVENTION

The present invention relates to a leadframe, a method of fabricating a light emitting diode package using the leadframe, and the light emitting diode package fabricated by the method, and more particularly to a leadframe having a heat sink support ring capable of fixing a heat sink to a leadframe to prevent the heat sink from being separated from a package body, a method of fabricating a light emitting diode package using the leadframe, and the light emitting diode package fabricated by the method.

The luminous power of the light emitting diode (hereinafter referred to as LED) is substantially proportional to the input power. Therefore, high luminous power can be obtained by increasing the electric power input to the LED. However, the increase of the input power results in the increase of the junction temperature of the LED. The increase of the junction temperature of the LED causes the loss of photometric efficiency which represents the conversion rate of input energy into visible light. Therefore, it is required to prevent the junction temperature of the LED from rising due to the increased input power.

One example of an LED package employing a heat sink to prevent the increase of the junction temperature of an LED is disclosed in U.S. Pat. No. 6,274,924 entitled "surface mountable LED package." According to the U.S. Pat. No. 6,274,924, the thermal coupling of the heat sink to a LED die enables the LED die to maintain a low junction temperature. Therefore, relatively higher input power can be supplied to the LED die to obtain higher luminous power.

However, the prior LED package is not structurally stable, since the heat sink can be easily separated from the package body. When the heat sink is separated from the package body, bonding wires electrically connecting the leads and the LED die mounted on an upper portion of the heat sink are cut off to bring an irreparable damage to the LED package. Consequently, the LED package capable of preventing the separation of the heat sink from the package body is required.

SUMMARY OF THE INVENTION

An embodiment of the present invention relates to providing an LED package capable of preventing the increase of junction temperature of an LED die under high input power, thereby obtaining high luminous power, and a method of fabricating the same.

Another embodiment of the present invention relates to providing an LED package capable of preventing a heat sink from being separated from a package body, and a method of fabricating the same.

Yet another embodiment of the present invention relates to providing a leadframe suitable for easily fabricating a structurally stable LED package with good heat dissipation characteristics.

One or more embodiments of the present invention provide a leadframe having a heat sink supporting ring, a method of fabricating a light emitting diode package using the leadframe, and the light emitting diode package fabricated by the method.

In accordance with one aspect of the present invention, a leadframe is provided. The leadframe includes a heat sink supporting ring for supporting a heat sink. An outer frame is spaced apart from the heat sink supporting ring, and encloses the heat sink supporting ring. At least one supporting lead connects the heat sink supporting ring and the outer frame to support the supporting ring. At least one separated lead is extended from the outer frame toward the heat sink supporting ring, and is spaced apart from the heat sink supporting ring. Accordingly, since a package body can be formed using an insertion molding technique after a heat sink is inserted into the leadframe, a structurally stable LED packagecan be fabricated with ease.

The heat sink supporting ring may be a C-type ring, that is a ring a portion of which is cut. The separated lead can be extended to the cut portion of the heat sink supporting ring.

At least two supporting leads may connect the heat sink supporting ring and the outer frame. The supporting leads are disposed at opposite sides of the heat sink supporting ring to stably support the heat sink supporting ring against the outer frame.

Also, at least two separated leads are extended from the outer frame toward the heat sink supporting ring. At least two separated leads are spaced apart from the heat sink supporting ring. The separated leads are disposed at another opposite sides of the heat sink supporting ring.

In accordance with another aspect of the present invention, a method of fabricating a light emitting diode package is provided. The method comprises preparing a leadframe and a heat sink. The leadframe includes a heat sink supporting ring for supporting a heat sink. An outer frame is spaced apart from the heat sink supporting ring, and encloses the heat sink supporting ring. At least one supporting lead connects the heat sink supporting ring and the outer frame to support the supporting ring. At least a separated lead is extended from the outer frame toward the heat sink supporting ring, and is spaced apart from the heat sink supporting ring. The heat sink is prepared so as to be inserted and fixed to the heat sink supporting ring. The heat sink is inserted and fixed to the heat sink supporting ring. Then, a package body supporting the heat sink, the supporting lead and the separated lead is formed using an insertion molding technique. The package body has an opening exposing a portion of each of the leads and an upper surface of the heat sink. At least one light emitting diode die is mounted on an upper surface of the heat sink, and bonding wires electrically connecting the LED die and at least two of the leads are formed. Then, an encapsulant covering the light emitting diode die is formed. As such, it is possible to fabricate the LED package capable of preventing the heat sink from being separated from the package body.

Meanwhile, the package body may have notches elongated from the upper edge portions thereof to the opening. The notches serve as an air vent for gas when forming an encapsulant using the molding technique. As such, an encapsulant having a lens shape is easily formed using a mold. The notches may be elongated from the opposite upper edge portions of the package body toward the opening.

The supporting lead and the separated lead are cut from the outer frame to form connecting leads. The connecting leads may be bent at an exterior of the package body.

The term "supporting lead" herein means a lead for connecting the outer frame and the heat sink supporting ring in the leadframe to support the heat sink supporting ring against the outer frame. The term "separated lead" herein means a lead extended from the outer frame toward the heat sink supporting ring but spaced apart from the supporting ring. In the meantime, the term "connecting lead" herein means a lead of the LED package to be electrically connected to an external circuit. The supporting lead and the separated lead may be used as a connecting lead of the LED package.

In accordance with another aspect of the present, a light emitting diode package is provided. The package comprises a heat sink supporting ring. A heat sink is inserted into the heat sink supporting ring. At least two connecting leads are disposed at both sides of the heat sink supporting ring to be electrically isolated from each other. A package body is attached to the heat sink and connecting leads to support them. The package body has an opening exposing a portion of the each connecting lead and an upper surface of the heat sink. According to the another aspect of the invention, the heat sink supporting ring supports the heat sink to prevent the heat sink from being separated from the package body.

All of the connecting leads may be spaced apart from the heat sink supporting ring. Otherwise, one of the connecting leads may be connected to the heat sink supporting ring.

The heat sink supporting ring may be a C-type ring, that is a ring a portion of which is cut. In this case, one of the connecting leads spaced apart from the supporting ring is extended to the cut portion of the heat sink supporting ring. As such, the connecting lead can be disposed closer to the heat sink.

A lower surface of the heat sink is exposed outwardly. Therefore, heat is dissipated through the lower surface of the heat sink. The heat sink may have a base and a protrusion protruding upward from a center portion of the base. The protrusion is inserted into the heat sink supporting ring. As such, the size of the LED package can be reduced, with a surface area of the heat dissipation maintained.

The heat sink may further have a supporting-ring holding groove for holding the support ring at a side of the protrusion to fasten the heat sink supporting ring. The supporting-ring holding groove may be a spiral groove. The heat sink supporting ring is fastened in the holding groove to firmly fix the heat sink.

The package body is a plastic resin formed by an injection molding of thermosetting or thermoplastic resin, after the heat sink is inserted into the heat sink supporting ring. As such, a complicated package body can be easily formed, and the heat sink is firmly fixed to the package body.

The package body may further have notches elongated from upper edge portions of the package body to the opening. The notches may be elongated from opposite upper edge portions of the package body to the opening.

The package body may further have a lens holding groove on an upper surface thereof along an outer periphery of the upper surface. The lens holding groove increases a contact area between the package body and the lens to prevent the lens from being released from the package body.

At least one light emitting diode die is mounted on the upper surface of the heat sink. The light emitting diode die is electrically connected to the connecting leads via bonding wires. Additionally, an encapsulant covers the light emitting diode die. The encapsulant protects the LED dies from external force and environment such as moisture. The encapsulant has hardness in the range of Durometer Shore 10A to Durometer Shore 70D so as to relieve mechanical and thermal stresses on the LED die.

In addition, a phosphor may be disposed over the LED die to convert the wavelength of the light emitted from the LED die. The phosphor may be incorporated in the encapsulant.

BRIEF DESCRIPTION OF THE DRAWINGS

The above features and advantages of the present invention will become more apparent by describing the preferred embodiment thereof with reference to the accompanying drawings, in which.

DETAILED DESCRIPTION OF THE INVENTION

Reference will now be made in detail to preferred embodiments of the present invention, examples of which are illustrated in the accompanying drawings.

Figure 1:
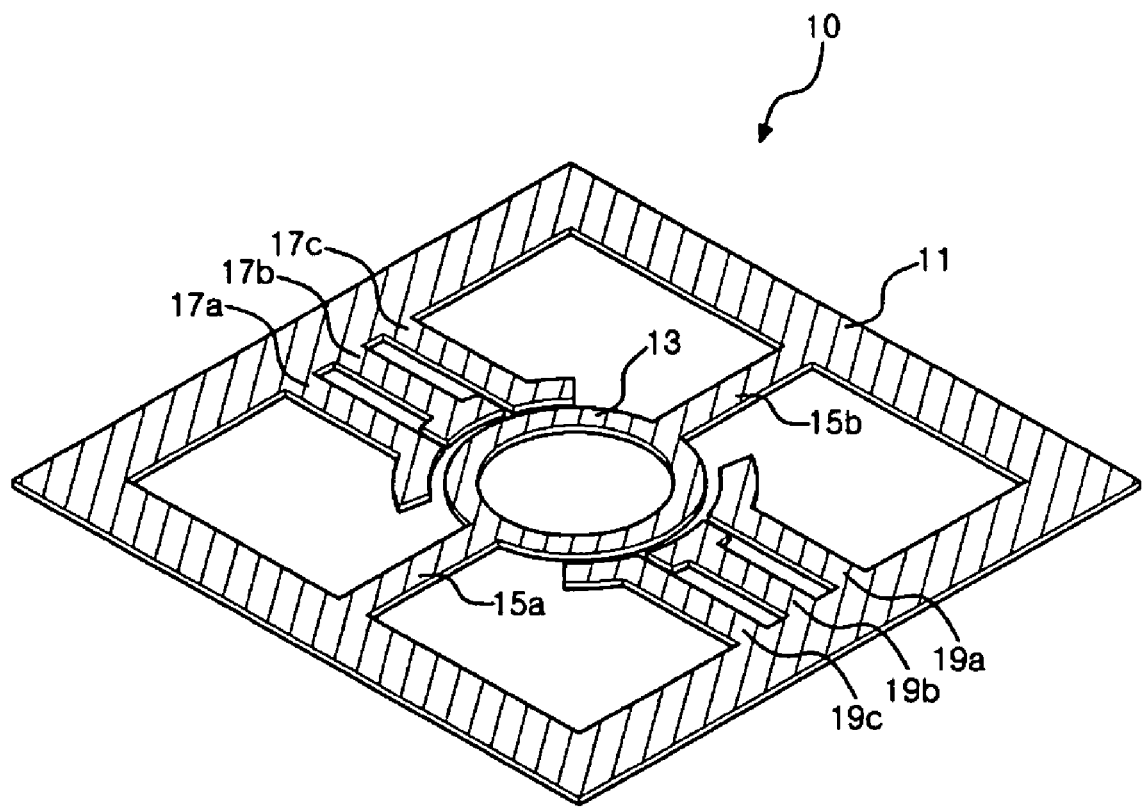
FIG. 1 is a perspective view of a leadframe according to one embodiment of the present invention.

FIG. 1 is a perspective view of a leadframe according to one embodiment of the present invention.

Referring to FIG. 1, a leadframe 10 includes a heat sink supporting ring 13 into which a heat sink can be inserted. The supporting ring 13 may be formed in a circular ring shape as shown in FIG. 1, which is not limited thereto, but may be formed in a polygonal ring shape.

The supporting ring 13 is enclosed by an outer frame 11. The outer frame 11 is spaced apart from the supporting ring 13. The outer frame 11 may be formed in a square shape as shown in FIG. 1, which is not limited thereto, but may be formed in a circular shape or polygonal shape.

The outer frame 11 and the supporting ring 13 are connected to each other via at least one supporting lead 15a and/or 15b. The supporting ring 13 is fixed to the outer frame 11 by the supporting lead. As shown in FIG. 1, the supporting leads 15a and 15b can be disposed at opposite sides of the supporting ring 13 to fix the supporting ring 13 to the outer frame 11. In addition to the supporting leads 15a and 15b, the supporting ring 13 may be connected to the outer frame 11 via additional supporting leads.

Furthermore, at least two separated leads 17a, 17b, 17c, 19a, 19b and 19c are extended from the outer frame 11 towards the supporting ring 13. The separated leads are spaced apart from the supporting ring 13. As shown in FIG. 1, the separated leads 17a, 17b, 17c, 19a, 19b and 19c may have a longitudinal end with a wider area in the vicinity of the supporting ring 13. Meanwhile, the separated leads may be disposed at opposite sides of the supporting ring 13.

The required number of the separated leads is determined by the type and the number of LED dies to be mounted and the connective configuration of bonding wires. However, the leadframe 10 may include multiple separated leads to fabricate various kinds of packages. The separated leads may be disposed in a direction perpendicular to the supporting leads 15a and 15b, as shown in FIG. 1.

Although six separated leads are shown in FIG. 1, fewer separated leads may be disposed, or additional separated leads may be further disposed.

The leadframe 10 according to one embodiment of the present invention may be fabricated by pressing a plate of phosphorous bronze with a die. Although one leadframe 10 is shown in FIG. 1, a plurality of leadframes 10 may be manufactured and arranged on one phosphorous bronze plate. In particular, a plurality of leadframes 10 fabricated on one phosphorous bronze plate are used to mass-produce the LED packages.

Figure 2:
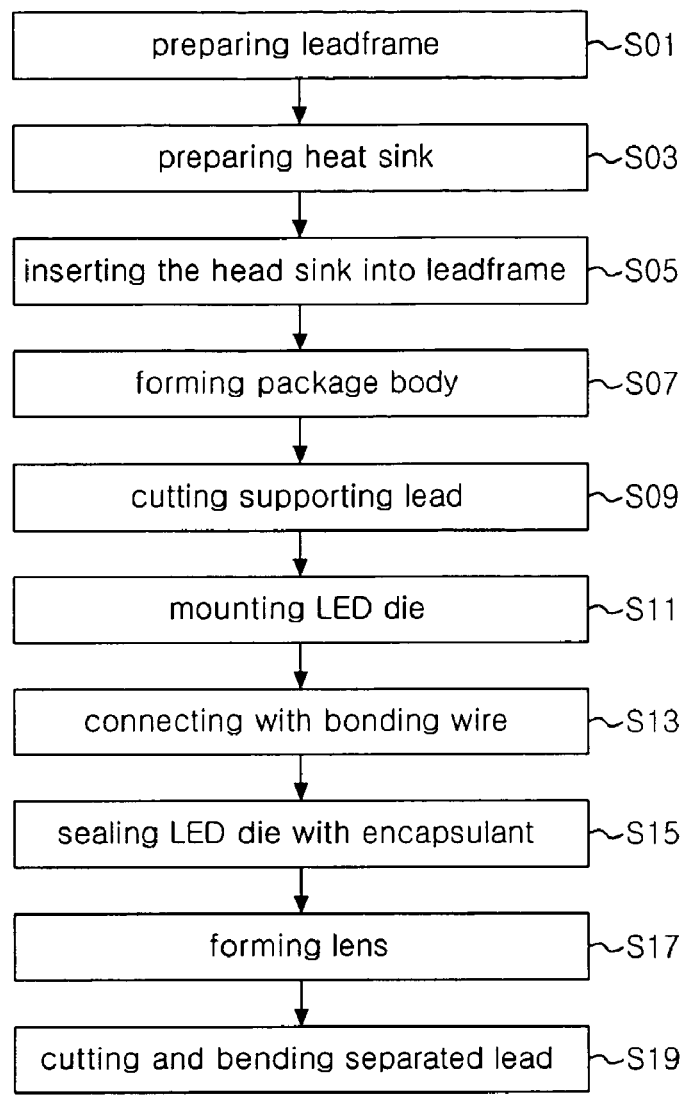
FIG. 2 is a process flow depicting a method of fabricating an LED package according to one embodiment of the present invention.

FIG. 2 is a process flow depicting a method of fabricating an LED package according to one embodiment of the present invention. FIGS. 3 through 14 are perspective views depicting a method of fabricating an LED package according to one embodiment of the present invention.

Referring to FIG. 2, the leadframe 10 described above with reference to FIG. 1 is prepared (S01). The leadframe 10 is fabricated by pressing the phosphorous bronze plate, or a plurality of leadframes 10 may be fabricated and arranged on one phosphorous bronze plate.

Figure 3:
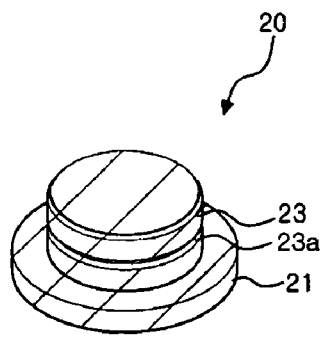
FIGS. 3 through 15 are perspective views depicting a method of fabricating an LED package according to one embodiment of the present invention based on the process flow in FIG. 2.

Referring to FIGS. 2 and 3, a heat sink 20 which can be inserted and fixed to the supporting ring 13 of the leadframe 10 is prepared (S03). The heat sink 20 has an upper surface on which the LED die is mounted. Preferably, the size of the upper surface of the heat sink 20 is smaller than the inner diameter of the supporting ring 13 to easily insert the heat sink into the supporting ring 13. Also, the side of the heat sink 20 has an outer diameter larger than the inner diameter of the supporting ring 13.

Also, the heat sink 20 may have a supporting-ring holding groove 23a to fasten to the supporting ring 13. Furthermore, the supporting-ring holding groove 23a may be provided with a spiral groove to easily fasten to the supporting ring 13.

The heat sink 20 has a base 21 and a protrusion 23 protruding upward from a center portion of the base 21. In this case, the supporting-ring holding groove 23a is formed at a side of the protrusion 23. The base 21 and the protrusion 23 may have a cylindrical shape, as shown in the drawings, which is not limited thereto, but may have a shape of a polygonal casing. The protrusion 23 is formed in the shape similar to an internal shape of the supporting ring 13, but the present invention is not limited thereto. That is, although the supporting ring 13 has a shape of a circular ring, the protrusion 23 may have a shape of a rectangular casing.

The heat sink 20 may be made of metal having a high thermal conductivity or a thermal conductive resin through pressing or molding technique. Also, the heat sink 20 is made by separate processes as those for the leadframe 10. Hence, the step S01 of preparing the leadframe 10 and the step S03 of preparing the heat sink 20 may be executed in reverse order or simultaneously.

Figure 4:
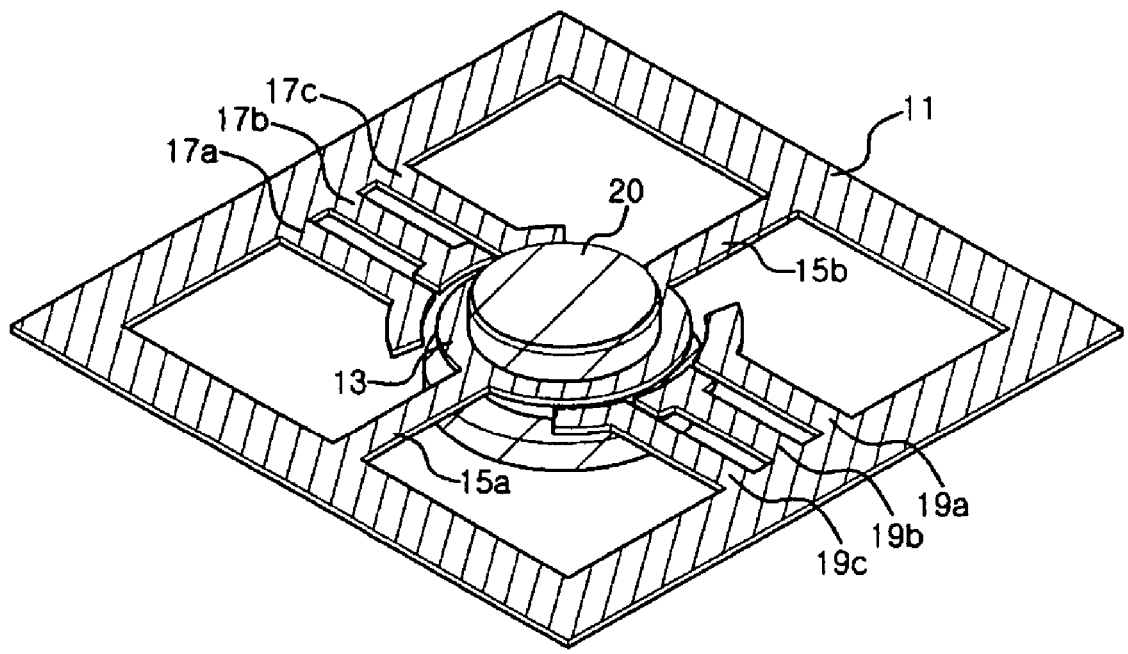

Referring to FIGS. 2 and 4, the heat sink 20 is inserted into and fixed to the supporting ring 13 of the leadframe 10 (S05). Since an outer diameter of the side of the heat sink 20 is larger than the inner diameter of the supporting ring 13, the heat sink 20 may be forcibly inserted and fixed to the supporting ring 13.

When the heat sink 20 is formed with the supporting-ring holding groove 23a, the supporting ring 13 is accepted into the supporting-ring holding groove 23a to support the heat sink 20. In this case, it is preferable that a portion of the supporting ring 13 is accepted into the supporting-ring holding groove 23a, and the remaining portion of the supporting ring 13 protrudes outward from the protrusion 23, as shown in the drawings. When the supporting-ring holding groove 23a is a spiral groove, the heat sink 20 is inserted into the supporting ring 13 by rotating the heat sink 20.

Figure 5:
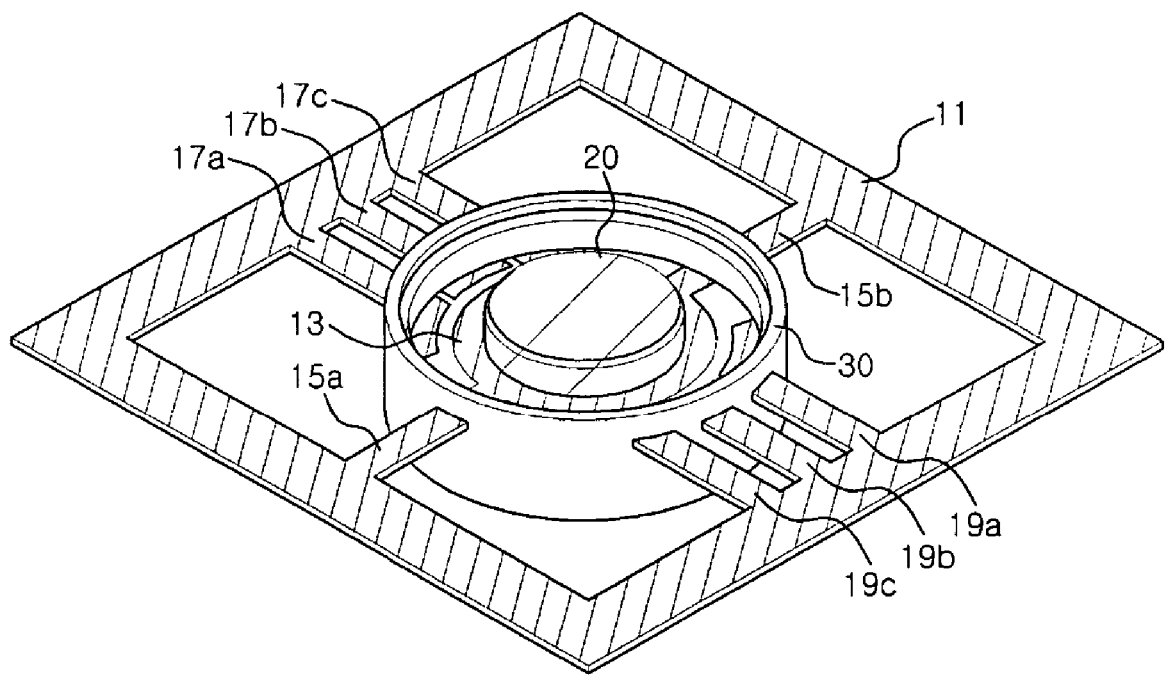

Referring to FIGS. 2 and 5, after the heat sink 20 is fixed to the leadframe 10, a package body 30 is formed using an insertion molding technique (S07). The package body 30 may be formed of thermosetting or thermoplastic resin through an injection molding.

The package body 30 is formed at the circumference of the heat sink 20 to support the support ring 13, the supporting leads 15a and 15b, the separated leads 17a, 17b, 17c, 19a, 19b and 19c, and the heat sink 20. The package body is attached to the heat sink and the leads. The supporting leads and separated leads partially protrude outward from the package body 30. Furthermore, the package body 30 has an opening that exposes an upper end of the heat sink 10 and the leads.

Figure 6:
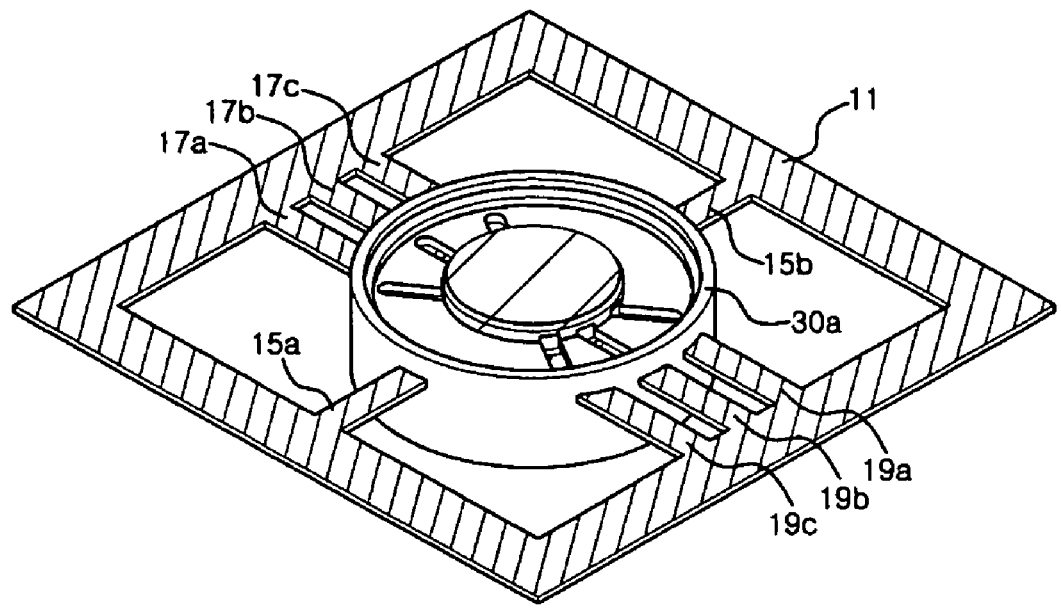

Referring to FIG. 5, the supporting ring 13 and the leads are exposed through the opening. Otherwise, as shown in FIG. 6, the package body 30a may cover most portions of the heat sink 20, the supporting ring 13 and the leads except for the upper end of the heat sink 20 and portions of the separated leads 17a, 17b, 17c, 19a, 19b and 19c. To this end, several openings may be provided.

Figure 7:
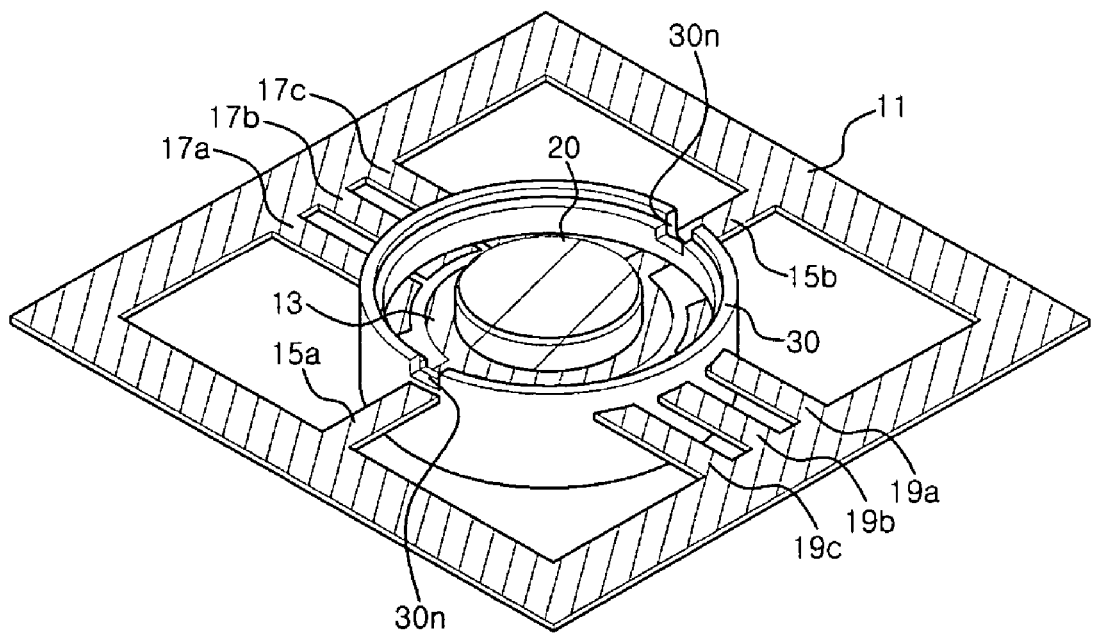

Meanwhile, the package body 30a may have notches 30n on its upper surface, as shown in FIG. 7. The notches are elongated from the upper edge portions of the package body 30 opposite to each other to the opening. The notches may have a bottom that is higher near the opening of the package body 30 and lower far from the opening of the package body 30.

Also, a lower surface of the heat sink 20 is outwardly exposed. Additionally, a side of the base 21 may be exposed. As such, heat dissipation through the heat sink 20 is accelerated.

The package body 30 is formed in a cylindrical shape, as shown in FIGS. 5, 6 and 7, which is not limited thereto, but may be formed in the shape of a polygonal casing (e.g. rectangular casing).

Since the package body 30 is shaped by injection molding the thermosetting or thermoplastic resin after the heat sink 20 is coupled to the leadframe 10, the heat sink 20 is firmly coupled to the package body 30.

Figure 8:
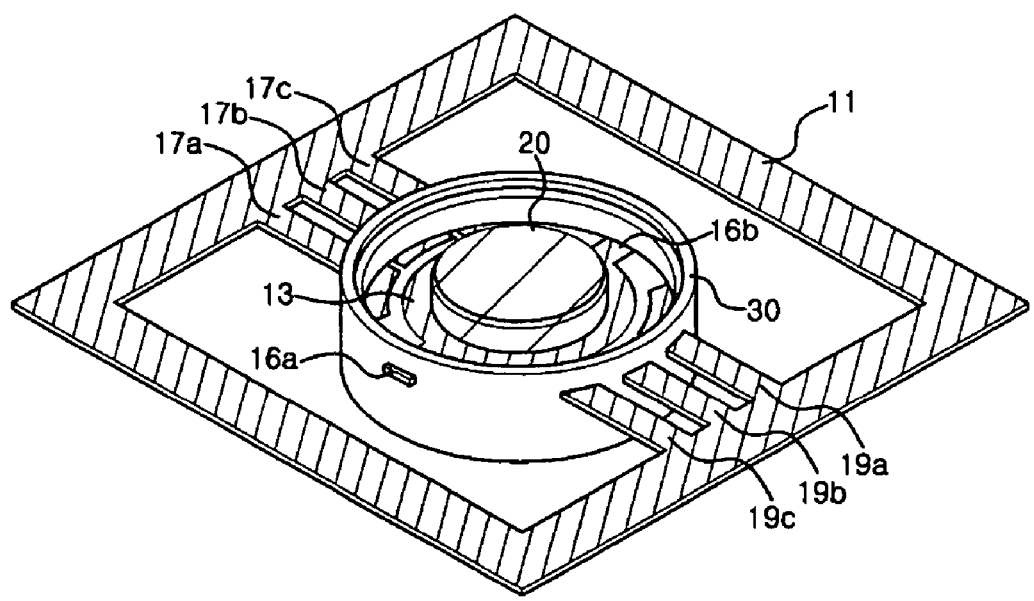

Referring to FIGS. 2 and 8, the supporting leads 15a and 15b protruding outward from the package body 30 are cut and removed (S09). Consequently, the cut supporting leads 16a and 16b are left on the package body 30, and the supporting leads 16a and 16b prevent the heat sink 20 from being separated from the package body 30.

Figure 9:
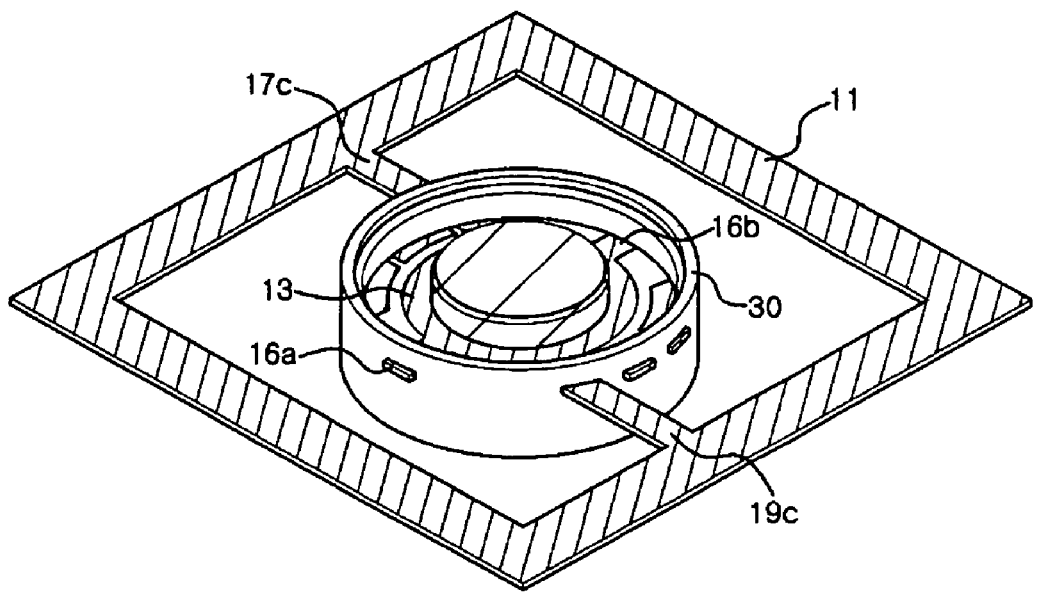
Figure 10:
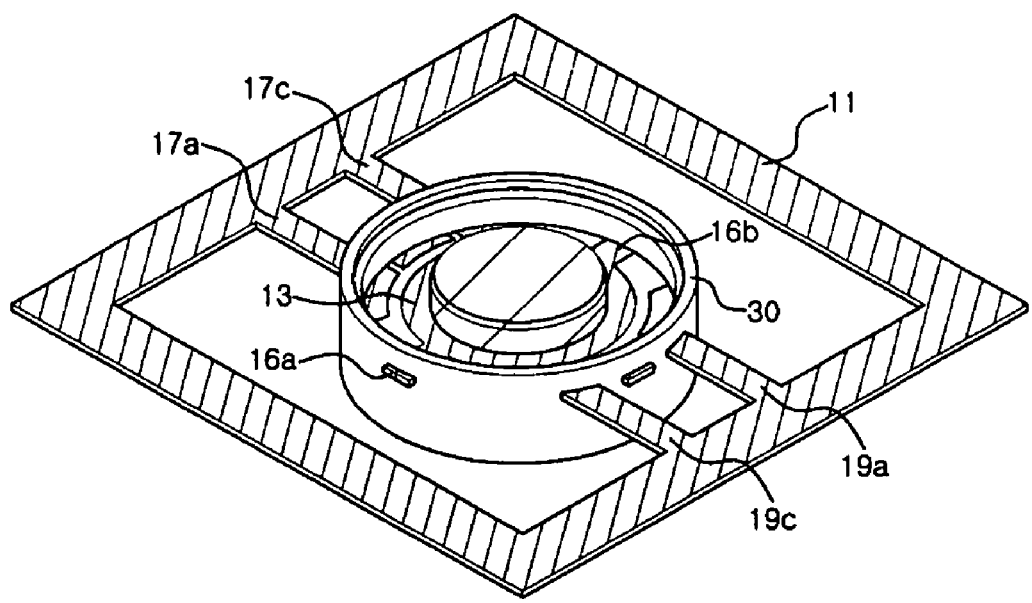

While the supporting leads are cut, the separated leads protruding outward from the package body 30 may be cut and removed except for the leads that will be used as current paths. As shown in FIG. 9, when only two separated leads 17c and 19c are required, the remaining separated leads 17a, 17b, 19a and 19b are cut and removed. Also, as shown in FIG. 10, when four separated leads 17a, 17c, 19a and 19c are required, the remaining separated leads 17b and 19b are cut and removed.

The process of cutting and removing the separated leads is performed when the number of separated leads provided on the leadframe 10 is more than the number of the separated lead required for the LED package. If the number of the separated leads required for the LED package equals the number of the separated leads provided on the leadframe 10, the process of cutting and removing the separated leads is not performed. Also, even if extra separated leads are left out, they do not influence the operation of the LED package. Hence, the process of cutting and removing the extra separated leads can be skipped.

Figure 11:
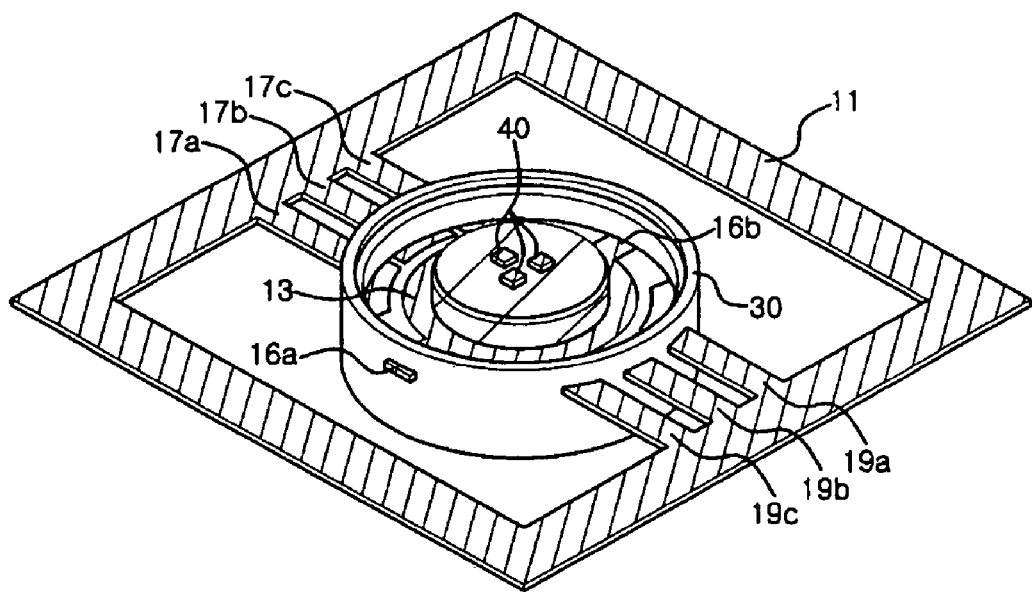

Referring to FIGS. 2 and 11, LED dies 40 are mounted on the upper surface of the heat sink 20(S11). Each of the LED dies 40 may be a so-called 1 bond-die having electrodes on the upper and lower surfaces thereof or a so-called 2 bond-die having two electrodes on the upper surface thereof.

If any one of the LED die 40 is 1 bond-die, it is preferable that the heat sink 20 be made of conductive metal, and that the 1 bond LED die 40 be mounted on the heat sink 20 by conductive adhesive such as silver (Ag) epoxy. If all of the LED dies 40 are 2 bond-dies, it is not necessary to make the heat sink 20 of conductive metal. Also, the LED dies 40 may be mounted on the heat sink 20 by other conductive adhesive, as well as the silver (Ag) epoxy.

A plurality of LED dies 40 may be mounted on the heat sink 20. In this case, the LED dies 40 may emit light of different wavelengths. For example, three LED dies 40 may be mounted, as shown in FIG. 11. The three LED dies 40 may emit light of red (R), green (G) and blue (B) colors respectively. As such, it is possible to provide a LED package radiating full colors of light using the LED dies 40.

Figure 12:
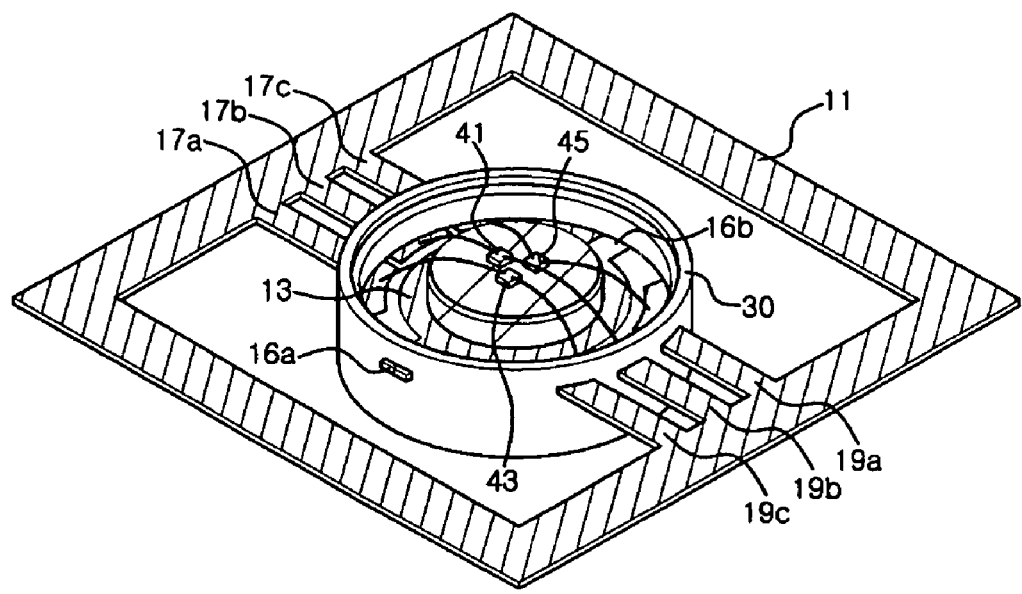

Referring to FIGS. 2 and 12, the LED dies 41, 43 and 45 are electrically connected to the separated leads 17a, 17b, 17c, 19a, 19b and 19c by bonding wires (S13). When the LED dies 41, 43 and 45 are all 2 bond-dies, each of the LED dies is electrically connected to two separated leads through two bonding wires. As shown in the drawings, each of the LED dies 41, 43 and 45 may be electrically connected to a different pair of separated leads. Also, one common separated lead (for example, 17b) is electrically connected to each of the LED dies by bonding wires, and other different separated leads (for example, 19a, 19b, 19c) opposite to the common separated lead are electrically connected to the LED dies by other bonding wires. In this case, each LED die may be operated by each different current, respectively.

Figure 13:
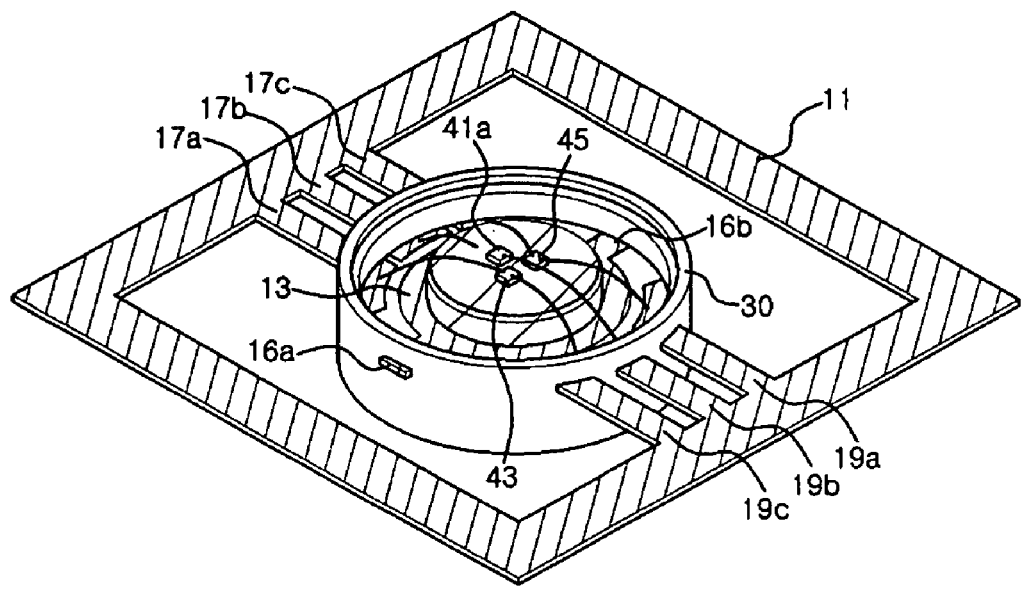

Referring to FIG. 13, a 1 bond-die 41a and 2 bond-dies 43 and 45 may be mounted together. In this case, one of the separated lead 17b is electrically connected to the heat sink 20 via a bonding wire. Hence, the separated lead 17b is electrically connected to the lower surface of the 1 bond-die 41a through the bonding wire and the heat sink 20. Various combinations of the 1 bond-die and the 2 bond-die are possible, and a method of connecting the bonding wires may be selected in variety.

Also, a method of connecting the separated leads and the LED dies may be selected in variety, and a plurality of the LED dies may be connected to each other in series, parallel or series-parallel.

Meanwhile, after the LED dies 41, 43 and 45 are electrically connected to the separated leads by the bonding wires, the LED dies 41, 43 and 45 are sealed by an encapsulant (not shown in the diagram) (S15). The encapsulant protects the LED dies from external force and environment such as moisture. To relieve mechanical or thermal stresses on the LED dies, the encapsulant is selected to have hardness in the range of Durometer Shore 10A to Durometer Shore 70D.

The opening of the package body 30 is filled with the encapsulant to seal the LED dies and the bonding wires.

Also, the encapsulant may incorporate a phosphor. For example, the phosphor may convert blue light into yellow light, or green light and red light. Therefore, when blue emitting LED die is mounted, a portion of light emitted from the LED is converted into yellow, or green and red to provide an LED package that emits white light externally. The phosphor is not limited to the ones that convert the light emitted by LED into above colors, and may be selected to provide an LED package for radiating the color wanted by the user, in addition to the white light. Also, the phosphor is not limited to being incorporated in the encapsulant, and may be deposited on the LED.

Furthermore, the encapsulant may incorporate a diffuser. The diffuser diffuses the light emitted from the LED dies to prevent the LED dies and the bonding wires from being shown from the exterior and to uniformly radiate the light outward.

After the LED dies are sealed by the encapsulant, a lens (not shown in the diagram) is formed on the package body 30 (S17). The lens is made of a transparent resin, such as epoxy resin or silicon resin, through a molding technique. In this case, the notches 30n formed on the upper portion of the package body 30 function as an air vent, as shown in FIG. 7. The lens is used to radiate the light in a constant orientation angle, and may be omitted, if it is not required. The encapsulant may be formed in a lens shape to function as the lens. In this case, a process of forming the lens is skipped.

Figure 14:
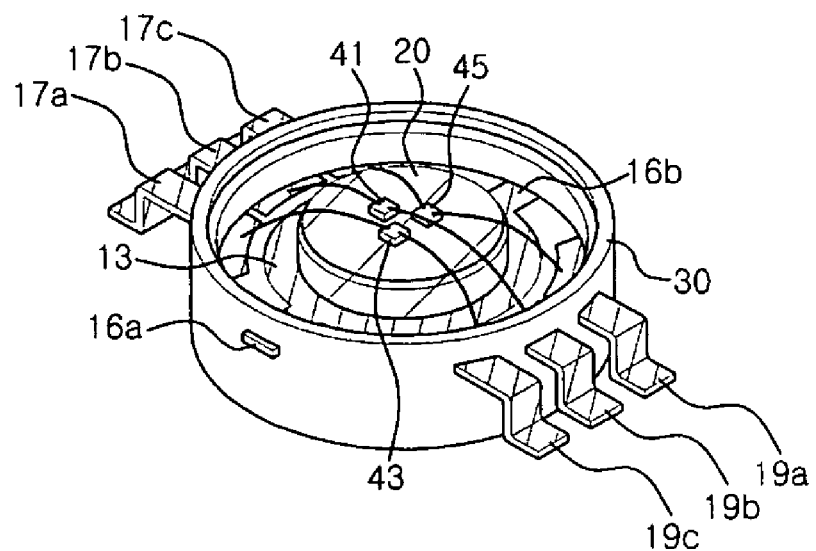

Referring to FIGS. 2 and 14, the separated leads 17a, 17b, 17c, 19a, 19b and 19c are cut from the outer frame 11 and bent (S19). As a result, connecting leads to be electrically connected to an external circuit are completed, and a surface-mountable LED package is provided. The step of cutting and removing the supporting leads (S09) may be performed together in step (S19) of cutting the separated lead from the outer frame 11.

Figure 15:
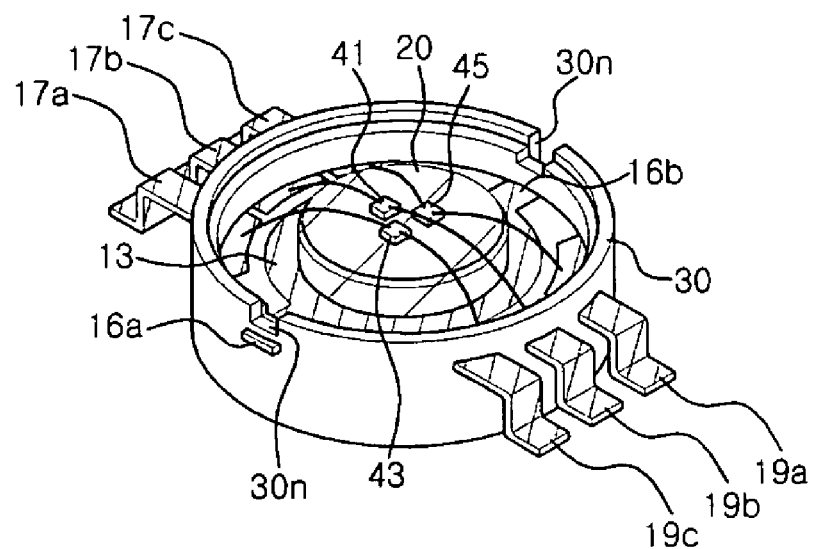

The LED package according to one embodiment of the present invention will now be described with reference to FIGS. 14 and 15.

Again referring to FIG. 14, the LED package includes a heat sink supporting ring 13. The heat sink supporting ring 13 may be made of copper alloy such as phosphorous bronze. The supporting ring 13 is formed in a circular ring shape, as shown in FIG. 14, which is not limited thereto, but may be formed in a polygonal ring shape. Cut supporting leads 16a and 16b are extended outward from the supporting ring 13. The cut supporting leads 16a and 16b may be disposed at the opposite sides of the supporting ring 13.

The heat sink 20, which is described referring to FIG. 3, is inserted into the supporting ring 13. Meanwhile, at least two connecting leads 17a, 17b, 17c, 19a, 19b and 19c are disposed at both sides of the supporting ring and are spaced apart from the supporting ring 13 and the heat sink 20. The connecting leads may be bent to be surface-mounted.

Additionally, the package body 30 is molded to support the heat sink 20 and the connecting leads. The package body 30 has an opening at an upper portion thereof to expose an upper surface of the heat sink 20 and a portion of the connecting lead. Meanwhile, the connecting leads penetrate a side wall of the package body 30 and protrude outward.

As described referring to FIG. 5, the supporting ring 13 and the supporting leads 15a and 15b are partially exposed through the opening. Hence, the upper portion of the package body 30 is formed with a groove. Also, as described referring to FIG. 6, the package body (30a in FIG. 6) may cover major portions of the heat sink 20 except for the upper end of the heat sink 20 and portions of the connecting leads. To this end, several openings may be provided. Furthermore, the package body 30 has notches 30n elongated from the upper edge portions to the opening, as shown in FIG. 15.

The package body 30 is a plastic resin formed by an injection molding of thermosetting or thermoplastic resin, after the heat sink 20 is inserted and fixed to the supporting ring 13.

Meanwhile, LED dies 41, 43 and 45 are mounted on the upper surface of the heat sink 20. Although the LED dies shown in FIG. 14 are so-called 2 bond-dies, which are not limited thereto, but the LED dies may be any one of so-called 1 bond-dies or combination of the 1 bond-die(s) and 2 bond-die(s).

The LED dies are electrically connected to the connecting leads through bonding wires. If the LED dies are the 2 bond-dies, each of the LED dies is electrically connected to two connecting leads via two bonding wires. If at least one of the LED dies is the 1 bond-die, the heat sink is electrically connected to at least one connecting leads via the bonding wire.

Various method of connecting the LED dies and the connecting leads is possible, and may be selected in variety depending on the desired characteristics of the LED package.

Meanwhile, the LED dies are sealed by an encapsulant (not shown in the diagram). Grooves formed on the upper portion of the package body 30 are filled with the encapsulant. Also, the encapsulant may incorporate a phosphor and/or a diffuser. The encapsulant may be formed in a lens shape. Alternatively, a lens (not shown in the diagram) may be formed on the package body 30 to cover the encapsulant.

According to this embodiment, the heat sink 20 is inserted into the heat sink supporting ring 13, so that it is possible to prevent the heat sink 20 from being separated from the package body 30.

In the LED package as described above, the connecting leads 17a, 17b, 17c, 19a, 19b and 19c are spaced apart from the supporting ring 13. The present invention is not limited thereto, and one of the connecting leads may be connected to the supporting ring 13. The LED package according to another embodiment of the present invention will now be described, in which one of the connecting leads may be connected to the supporting ring 13.

Figure 16:
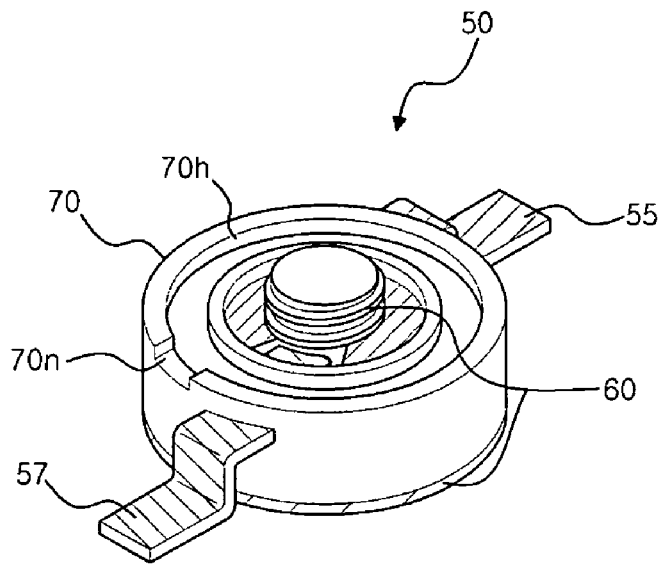
FIGS. 16 and 17 are a perspective view and a top plan view depicting an LED package according to another embodiment of the present invention, respectively.
Figure 17:
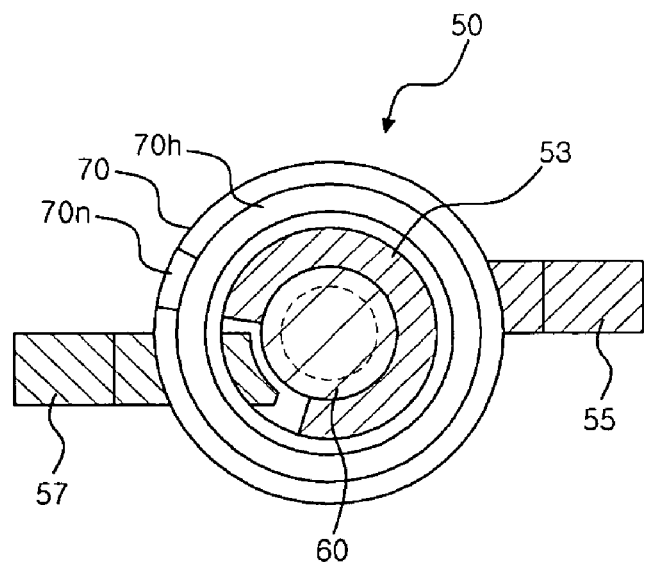
Figure 18:
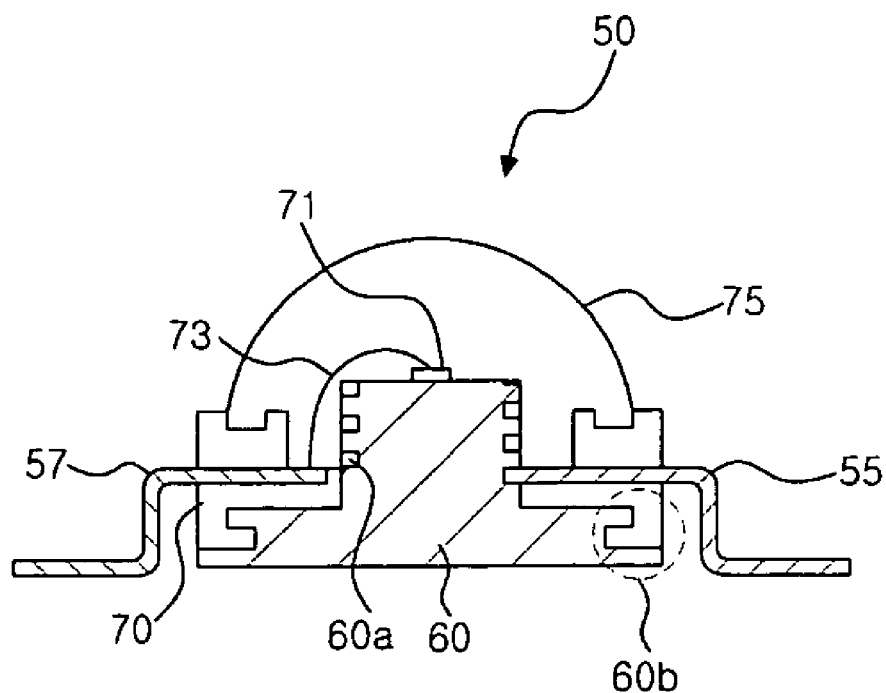
FIG. 18 is a cross-sectional view depicting the LED package in FIG. 16, on which an LED die and a lens are mounted, according to another embodiment of the present invention.
Figure 19:
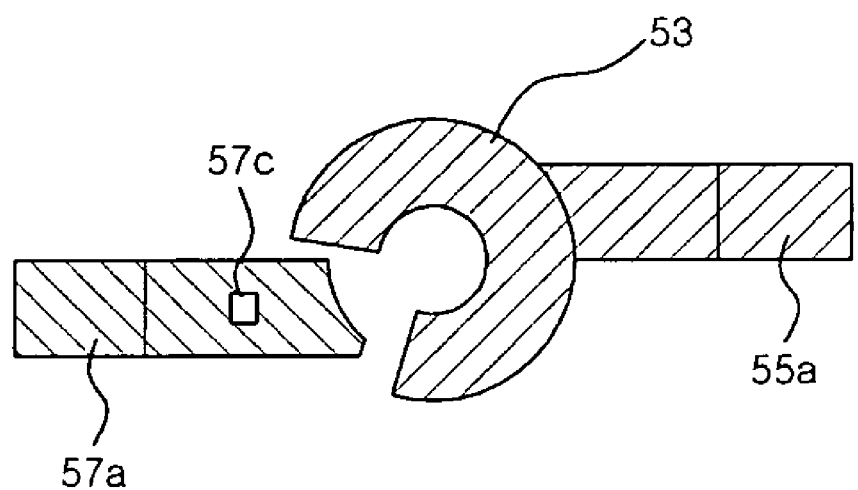
FIGS. 19 and 20 are top plan views depicting leadframes usable for fabricating an LED package according to another embodiment of the present invention, respectively.
Figure 20:
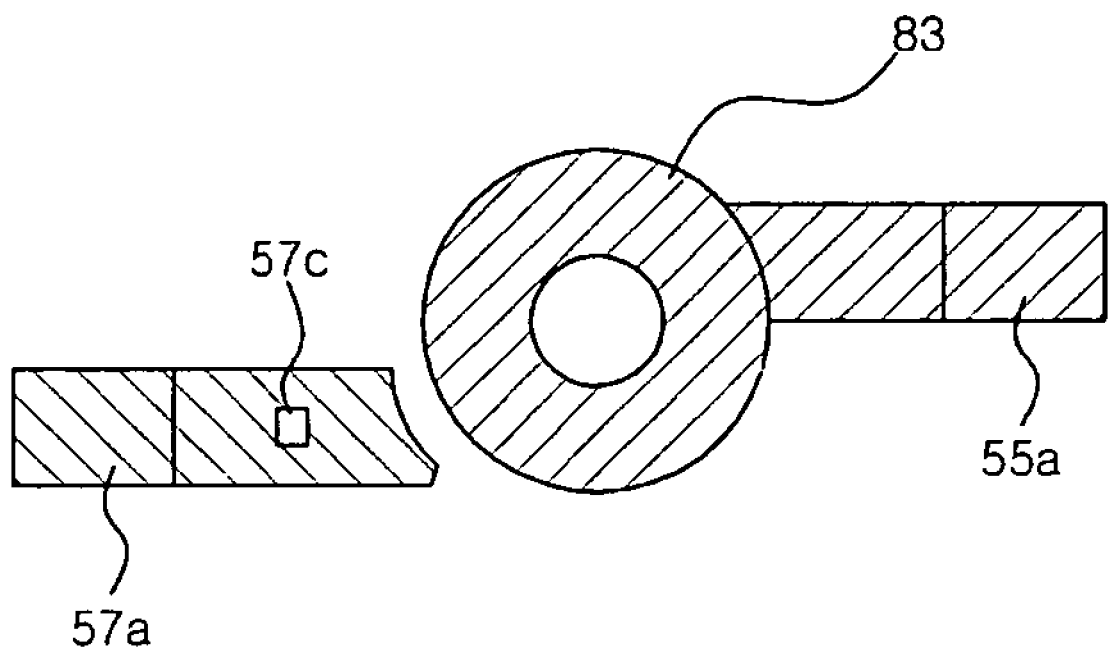

FIGS. 16 and 17 are a perspective view and a top plan view depicting an LED package 50 according to another embodiment of the present invention, respectively. FIG. 18 is a cross-sectional view depicting the LED package 50 in FIG. 16, on which an LED die and a lens 75 are mounted. FIGS. 19 and 20 are top plan views depicting leadframes usable for fabricating the LED package 50 according to another embodiment of the present invention, respectively.

Referring to FIGS. 16 through 18, the LED package 50 includes a heat sink supporting ring 53, a heat sink inserted into the supporting ring 53, connecting leads 55 and 57, and a package body 70.

The heat sink supporting ring 53 may be a C-type ring, that is a ring portion of which is cut, as shown in FIG. 19, which is not limited thereto, and the supporting ring may be formed in a closed ring as a supporting ring 83 shown in FIG. 20.

The connecting lead 55 is extended outward from the supporting ring 53. Also, the connecting lead 57 is spaced apart from the supporting ring 53 and disposed in the vicinity of the supporting ring 53. If the supporting ring 53 is the C-type ring, the connecting lead 57 may be elongated to the cut portion of the supporting ring 53. Hence, the end of the connecting lead 57 can be disposed at a position relatively close to a center of the supporting ring 53. As a result, compared to the leadframe shown in FIG. 20, the size of the package body 70 can be reduced using the leadframe having C-type supporting ring 53. Preferably, a portion removed from the supporting ring 53 is below ¼ the size of the entire supporting ring. That is, as the removed portion gets smaller, an interface between the supporting ring 53 and the heat sink 60 is increased to strengthen electrical connection.

As shown in FIG. 19 or FIG. 20, the connecting lead 55 originates from a supporting lead 55a which connects the supporting ring 53 and the outer frame (11 in FIG. 1) enclosing the heat sink supporting ring. The connecting lead 57 originates from a separated lead 57a extended from the outer frame toward the supporting ring 53. Therefore, the supporting ring 53 and the leads 55a and 57a can be fabricated together by pressing one plate of phosphorous bronze. In addition to the supporting lead 55a, the supporting ring 53 may be connected to the outer frame by other supporting leads. The separated leads 57a as well as additional separated leads spaced apart from the supporting ring 53 can be disposed. Meanwhile, the separated lead 57a may have a longitudinal end with a wider area in the vicinity of the supporting ring 53, as the separated leads shown in FIG. 1, to prevent the separated lead from being separated from the package body 70. As shown in the drawings, the separated lead may be formed with a through-hole 57c. The through-hole 57c accepts a portion of the package body 70 to prevent the separated lead 57a from being released from the package body.

The heat sink 60 is inserted and fixed to the supporting ring 53. The heat sink 60 has a base and a protrusion protruding upward from a center portion of the base and inserted into the supporting ring 53, as shown and described in FIG. 3. Also, the protrusion is formed with a supporting ring holding groove at a side thereof. The holding groove may be formed in a circular shape along an outer side of the protrusion or formed with a spiral groove. The heat sink having the spiral groove 60a is shown herein. Since the heat sink has the spiral groove, the heat sink 60 can be inserted into the supporting ring by rotational motion. The heat sink 60 is directly electrically connected to the connecting lead 55 via the supporting ring 53.

The heat sink 60 can be formed with a latching groove at a side 60b of the base. The latching groove may be formed at one portion of the side 60b of the base, or be continuously formed along the side of the base. When a bottom surface of the heat sink 60 is wider, the heat dissipation is promoted. Therefore, a lower end of the base side may be exposed to the exterior, as shown in FIGS. 16 and 18. However, the latching groove and the side of the base above the latching groove are covered by the package body 70. Hence, the latching groove accepts a portion of the package body 70, thereby further preventing the heat sink 60 from being released from the package body 70.

The heat sink 60 is made of conductive material, for example, copper (Cu), aluminum (Al) or an alloy thereof. The heat sink 60 may be formed by molding or pressing technology.

The package body 70 is attached to the heat sink 60 and the connecting leads 55 and 57 to support them. After the heat sink 60 is inserted into the supporting ring 53, the package body 70 is formed by an insertion molding of thermosetting or thermoplastic resin. Hence, the package body 70 fills the latching groove of the heat sink 60, and is attached to the heat sink 60 and the connecting leads 55 and 57 to join them.

Also, the package body 70 has an opening that exposes an upper end of the heat sink 60 and a portion of the connecting lead 57. Also, the opening may expose a portion of the connecting lead 55. In this case, the protrusion of the heat sink 60 may protrude from the upper surface of the package body 70, as shown in FIG. 18. The package body 70 may be provided on the upper surface thereof with a lens holding groove 70h along the outer periphery. The lens holding groove 70h holds a lens 75 to prevent the lens 75 from being separated from the package body 70. In addition, the package body 70 is provided on the upper surface thereof with a notch 70n. The notches 70n may be positioned at opposite sides, as shown in FIG. 15.

Again referring to FIG. 18, an LED die 71 is mounted on the heat sink 60. The LED die 71 may be fabricated of a compound semiconductor such as (Al, In, Ga)N, and be selected to emit light of desired wavelength. For example, the LED die 71 is a compound semiconductor emitting light of blue color.

The LED die 71 may be a so-called 1 bond-die having electrodes on its upper and lower surfaces, respectively. The lower electrode is adhered to the heat sink 60 by a conductive adhesive such as silver (Ag) epoxy. Since the heat sink 60 is directly electrically connected to the connecting lead 55, the LED die 71 is electrically connected to the connecting lead 55 via the heat sink. Hence, the bonding wire for connecting the LED die 71 and the connecting lead 55 may be omitted. Meanwhile, the upper electrode of the LED die 71 is electrically connected to the connecting lead 57 via the bonding wire 73.

In contrast, the LED die 71 may be a so-called 2 bond-die having two electrodes on a same surface. In this case, two electrodes are electrically connected to the connecting leads 55 and 57 via the bonding wire, respectively. However, since the connecting lead 55 is directly electrically connected to the heat sink 60, the LED die 71 may be connected to the heat sink 60 by using the bonding wire. Hence, a wiring process of connecting the LED die 71 and the heat sink 60 using the boding wire is easily performed than the prior art.

Meanwhile, the LED die is sealed by an encapsulant. The encapsulant may be an epoxy resin or a silicon resin. Also, the encapsulant may incorporate a phosphor capable of converting a wavelength of light emitted from the LED die 71. For example, in the case where the LED die 71 emits blue light, the encapsulant incorporates a phosphor capable of converting the blue light into yellow light, or green light and red light. As a result, the LED package emits white light outward.

The encapsulant is covered by the lens 75. The lens 75 may have a convex lens, as shown in FIG. 18, such that the light is emitted from the LED die 71 in a constant orientation angle. The lens 75 may be formed by molding a transparent resin such as silicon resin or epoxy resin. The lens 75 fills the lens holding groove 70h. Hence, the adhesion between the lens 75 and the package body 70 is increased to prevent the lens from being released from the LED package.

Meanwhile, the encapsulant may be formed in a lens shape, and thus the encapsulant may be integrally formed with the lens 75. In this case, the encapsulant fills the opening and lens holding groove 70h of the package body 70.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

With the above description, according to the embodiments of the present invention, there is provided the LED package employing the heat sink to have good heat dissipation and thus obtaining high luminous power, and a method of fabricating the same. Also, since a heat sink supporting ring is used to prevent the heat sink from being separated from the package body, the structurally stable LED package can be provided. In addition, there is provided a leadframe suitable for fabricating the LED package having structural stability and good heat dissipation with ease.

What is claimed is:

1. A packaged light emitting diode comprising:
    a heat sink supporting ring having an opening;
    a heat sink inserted into the opening of the heat sink supporting ring, the heat sink having an upper surface that extends above an upper surface of the heat sink supporting ring when the heat sink is inserted into the heat sink supporting ring;
    a light emitting diode provided on the upper surface of the heat sink;
    a package body supporting the heat sink and the heat sink supporting ring, the package body having an opening exposing the upper surface of the heat sink;
    a first set of leads extending outward from a first side of the package body, each of the leads of the first set having a proximate end that is provided proximate to the heat sink supporting ring, each proximate end of the leads of the first set being spaced apart from the heat sink supporting ring and from each other; and
    a second set of leads extending outward from a second side of the package body, each of the leads of the second set having a proximate end that is provided proximate to the heat sink supporting ring, each proximate end of the leads of the second set being spaced apart from the heat sink supporting ring and from each other,
    wherein the upper surface of the heat sink extends at least partly above an upper surface of the package body, so that the light emitting diode provided on the upper surface of the heat sink is provided at least partly above the upper surface of the package body.

2. The packaged light emitting diode as claimed in claim 1, further comprising:
    a first supporting lead connected to the heat sink supporting ring and extends into one side of the package body; and
    a second supporting lead connected to the heat sink supporting ring and extends into another side of the package body.

3. The packaged light emitting diode as claimed in claim 1, wherein each of the leads of the first set is electrically coupled to a different light emitting diode provided on the heat sink.

4. The packaged light emitting diode as claimed in claim 1 wherein the heat sink supporting ring is a C type ring having a cut portion.

5. The packaged light emitting diode as claimed in claim 1, wherein the heat sink has a base and a protrusion protruding upward from a center portion of the base, and the protrusion is inserted into the heat sink supporting ring.

6. The packaged light emitting diode as claimed in claim 5, wherein the protrusion is configured to receive the light emitting diode thereon.

7. The packaged light emitting diode as claimed in claim 5, wherein the heat sink further comprises a supporting-ring holding groove at a side of the protrusion to hold the supporting ring.

8. The packaged light emitting diode as claimed in claim 7, wherein the supporting-ring holding groove is a spiral groove.

9. The packaged light emitting diode as claimed in claim 1, wherein the package body is a plastic resin formed by an injection molding of thermosetting resin after the heat sink is inserted into the opening of the heat sink supporting ring.

10. The packaged light emitting diode as claimed in claim 9, wherein the package body comprises notches elongated from opposite upper edge portions of the package body to the opening.

11. The packaged light emitting diode as claimed in claim 9, wherein the package body has a lens holding groove along an outer periphery of an upper surface thereof.

12. The packaged light emitting diode as claimed in claim 1, further comprising:
an encapsulant covering an upper portion of the light emitting diode die,
wherein the package body is bonded to the heat sink supporting ring and the heat sink by forming the package body after the heat sink has been inserted into the heat sink supporting ring, so that the heat sink and the heat sink supporting ring are securely held by the package body.

13. The packaged light emitting diode as claimed in claim 12, wherein the encapsulant has a hardness in the range of from Durometer Shore 10A to Durometer Shore 70D.

14. The packaged light emitting diode as claimed in claim 12, further comprising:
a phosphor disposed over the light emitting diode die, the phosphor converting a wavelength of light emitted from the light emitting diode die to another wavelength.

15. A method of fabricating a packaged light emitting diode comprising:
providing a leadframe, the leadframe including:
a heat sink supporting ring having an opening;
an outer frame spaced apart from the heat sink supporting ring and enclosing the heat sink supporting ring;
at least one supporting lead for connecting the heat sink supporting ring and the outer frame;
a first set of separated leads extending from a first side of the outer frame toward the heat sink supporting ring, each of the separated leads of the first set having a proximate end that is provided proximate to the heat sink supporting ring, each proximate end of the separated leads of the first set being spaced apart from the heat sink supporting ring and from each other; and
a second set of separated leads extending from a second side of the outer frame toward the heat sink supporting ring, each of the separated leads of the second set having a proximate end that is provided proximate to the heat sink supporting ring, each proximate end of the separated leads of the second set being spaced apart from the heat sink supporting ring and from each other;
inserting a heat sink into the opening of the heat sink supporting ring;
forming a package body exposing first and second surfaces of the heat sink after the heat sink is inserted into the heat sink supporting ring, so that the heat sink and the heat sink supporting ring are securely held by the package body; and
mounting at least one light emitting diode die on the first surface of the heat sink.

16. The method as claimed in claim 15, further comprising:
cutting the supporting lead and the separated lead from the outer frame to form connecting leads, wherein the first and second surfaces are upper and lower surfaces, respectively.

17. The method as claimed in claim 15, further comprising:
forming an encapsulant covering the light emitting diode die.

18. A packaged light emitting diode comprising:
a heat sink supporting ring having an opening;
a heat sink inserted into the opening of the heat sink supporting ring, the heat sink having a substantially planar surface as an upper surface, the upper surface of the heat sink extending above the heat sink supporting ring when the heat sink is inserted into the heat sink supporting ring;
a light emitting diode provided on the upper surface of the heat sink;
a package body supporting the heat sink and the heat sink supporting ring, the package body having an opening over the upper surface of the heat sink;
a first lead extending outward from a first side of the package body and having a proximate end that is provided proximate to the heat sink supporting ring, the proximate end of the first lead being spaced apart from the heat sink supporting ring; and
a second lead extending outward from a second side of the package body and having a proximate end that is provided proximate to the heat sink supporting ring.

19. The packaged light emitting diode of claim 18, wherein the upper portion of the heat sink is provided, such that the light emitting diode is at a higher position than the upper portion of the package body.

* * * * *